United States Patent [19]

Vander Mey

[11] 4,215,005

[45] Jul. 29, 1980

[54] ORGANIC STRIPPING COMPOSITIONS AND METHOD FOR USING SAME

[75] Inventor: John E. Vander Mey, Stirling, N.J.

[73] Assignee: Allied Chemical Corporation, Morris Township, Morris County, N.J.

[21] Appl. No.: 873,340

[22] Filed: Jan. 30, 1978

Related U.S. Application Data

[63] Continuation-in-part of Ser. No. 729,515, Oct. 4, 1976, Pat. No. 4,165,295.

[51] Int. Cl.$^2$ .................. C11D 7/08; C11D 7/32; C11D 7/34; C11D 7/50
[52] U.S. Cl. ................................. 252/153; 134/3; 134/38; 134/41; 252/143; 252/148; 252/171
[58] Field of Search .................. 252/79.3, 79.4, 142, 252/153, 170, 171, 558, 143, 148; 134/38, 3, 41; 156/2

[56] References Cited

U.S. PATENT DOCUMENTS

| | | | |
|---|---|---|---|
| 2,399,134 | 4/1946 | Miller et al. | 252/143 |
| 2,499,283 | 2/1950 | Robinson | 252/148 |
| 2,687,346 | 8/1954 | McDonald | 252/142 X |
| 2,814,593 | 11/1957 | Beiswanger et al. | 252/8.55 |
| 3,060,071 | 10/1972 | Kinder . | |
| 3,075,923 | 1/1963 | Berst et al. | 252/143 X |
| 3,113,113 | 12/1963 | Marsh et al. | 252/392 |
| 3,335,087 | 8/1967 | Keers | 252/143 |
| 3,335,088 | 8/1967 | Mandell | 252/143 |
| 3,582,401 | 6/1971 | Berilla et al. | 252/143 X |
| 3,598,741 | 8/1971 | Kann | 252/79.3 |
| 3,600,321 | 8/1971 | Tedeschi et al. | 252/148 |
| 3,629,004 | 12/1971 | Cooper et al. | 252/143 X |
| 3,650,969 | 3/1972 | Baltakmens et al. | 252/143 |
| 3,654,001 | 4/1972 | Mann . | |
| 3,779,935 | 12/1973 | McDougall et al. | 252/149 |
| 3,871,929 | 3/1975 | Schevey et al. . | |
| 3,932,130 | 1/1976 | Bennett et al. | 21/2.7 |
| 3,936,316 | 2/1976 | Gulla | 134/3 |
| 3,988,256 | 10/1976 | Vander Mey et al. | 252/171 |
| 4,009,115 | 2/1977 | Binns | 252/142 |
| 4,070,203 | 1/1978 | Neisius et al. | 134/3 |
| 4,124,407 | 11/1978 | Binns | 134/3 |

FOREIGN PATENT DOCUMENTS 734389  5/1966  Canada .

Primary Examiner—P. E. Willis, Jr.
Attorney, Agent, or Firm—Alan M. Doernberg; Jay P. Friedenson

[57] ABSTRACT

Improved organic stripping compositions useful in removing polymeric organic substances, such as photoresists, from aluminized inorganic substrates, which comprise one or more organic sulfonic acids, such as linear dodecylbenzene-sulfonic acid, toluenesulfonic acid and phenolsulfonic acid, one or more organic solvents and, optionally, phenol. A hydrogen fluoride complex is incorporated into the composition comprising HF at about 5 to 300 pm by weight of fluoride per weight of composition and at least about 0.1 mols per mol of HF of a complexing agent, such as morpholine or dimethyl formamide, having a nitrogen with an unshared electron pair. The hydrogen fluoride complex reduces aluminum corrosion during stripping even after repeated use at high temperature as is common in industrial semiconductor photoresist stripping.

20 Claims, No Drawings

ORGANIC STRIPPING COMPOSITIONS AND METHOD FOR USING SAME

CROSS-REFERENCE TO RELATED APPLICATION

This is a continuation-in-part of my application Ser. No. 729,515, filed Oct. 4, 1976, now Patent No. 4,165,295.

BACKGROUND OF THE INVENTION

1. Field of the Invention

This invention relates to improved organic compositions containing organic sulfonic acids and fluoride ion which are useful as stripping agents in removing polymeric organic substances, such as photoresists, from aluminized inorganic substrates.

2. Brief Description of the Prior Art

During manufacture of semi-conductors and semi-conductor microcircuits, it is frequently necessary to coat the materials from which the semi-conductors and microcircuits are manufactured with a polymeric organic substance which is generally a photoresist, i.e. a substance which forms an etch resist upon exposure to light. Subsequently, the polymeric organic substance must be removed from the surface of the organic substrate which is typically a silicon dioxide coated silicon wafer and may also contain metallic microcircuitry, such as aluminum, on the surface. Therefore, there is a need for improved stripping compositions which will remove the polymeric organic substance from the coated inorganic substrate without corroding, dissolving or dulling the surface of the metallic circuitry or chemically altering the inorganic substrate.

Prior art methods are known for removing such polymeric organic substances by the use of organic compositions containing phenol and linear alkylbenzenesulfonic acids, as exemplified in U.S. Pat. No. 3,871,929 (Schevey, Kremers to Allied Chemical, issued March, 1975) or containing linear alkylbenzenesulfonic acids and aromatic, aliphatic or chlorinated aliphatic and aromatic solvents, but not phenol, as disclosed in a pending U.S. Application Ser. No. 740,154 (Vander Mey to Allied Chemical, filed Nov. 8, 1976).

Relative organic compositions containing at least about 0.05% of anhydrous hydrofluoric acid as a stripping agent and organic solvents and solubilizing agents for the hydrofluoric acid, for removing paint from metallic surfaces, are known in the prior art, as exemplified in U.S. Pat. No. 3,335,087 (Keers to Pennsalt, issued Aug., 1967), and U.S. Pat. No. 3,335,088 (Mendell to Pennsalt, issued Aug., 1967).

Prior art inorganic stripping compositions for removing polymeric organic substances comprise aqueous sulfuric acid compositions containing at least about 300 ppm of fluoride ion to reduced metallic dulling and corrosion, as exemplified in U.S. Pat. No. 3,932,130 (Bennett, Brockington to Texaco, issued January, 1976), U.S. Pat. No. 3,654,001 (Mann to North American Rockwell, issued April, 1972) and U.S. Pat. No. 3,060,071 (Kinder to Allied Research, issued Oct., 1962).

However, the disadvantages of the above mentioned inorganic compositions in photoresist removal applications are that they tend to cause undesirable etching of the silicon dioxide substrates due to their high concentration of flouride ion. The above mentioned organic compositions have the disadvantages of either producing undersirable dulling of the aluminum surface by formation of metallic oxides or undesirable etching of the silicon dioxide substrate.

It is an object of this invention to provide improved organic stripping compositions which cleanly and efficiently remove organic photoresist materials from aluminized inorganic substrates, particularly aluminized silicon dioxide, without causing substantial etching of the inorganic substrate or corrosion and dulling of the metallic circuitry on the surface of the inorganic substrate, even after repeated use at elevated temperatures.

It is also an object of this invention to provide a method for removing polymeric organic substances from the surfaces of aluminized inorganic substrates, particularly aluminized silicon dioxide, without causing etching of the inorganic substrate or corrosion and dulling of the metallic circuitry on the surface of the inorganic substrate.

BRIEF DESCRIPTION OF THE INVENTION

In accordance with this invention, there are provided improved organic stripping compositions for removing polymeric organic substances from aluminized inorganic substrates which include at least one organic sulfonic acid of the following formula:

$$R-SO_3H$$

wherein R is an organic radical selected from the group consisting of alkyl containing 1 to 18 carbon atoms, monohydroxyalkyl containing 1 to 18 carbon atoms, aryl containing 6 to 10 carbon atoms, monoalkylaryl wherein the alkyl group contains 1 to 14 carbon atoms, dialkylaryl wherein each alkyl group contains 1 to 4 carbon atoms, monohydroxyaryl containing 6 to 10 carbon atoms, monoalkyl-hydroxyaryl containing 7 to 11 carbon atoms and monochloro-hydroxyaryl containing 6 to 10 carbons atoms, at least one organic solvent and optionally, phenol, wherein the improvement comprises incorporating a hydrogen fluoride complex comprising HF at about 5 to about 300 ppm by weight of fluoride per weight of composition and at least about 0.1 mols per mol of HF of an organic complexing agent having a nitrogen with an unshared electron pair selected from the group consisting of heterocyclic aromatic and cycloalipatic compounds containing a cyclic nitrogen with an unshared electron pair, N-substituted and unsubstituted amides and substituted and unsubstituted anilines.

Also in accordance with this invention, there is provided a method for stripping a polymeric organic substance from a metallized inorganic substrate comprising contacting the polymeric organic substance with an organic stripping composition of this invention at a temperature of about 20° to about 180° C.

DETAILED DESCRIPTION OF THE INVENTION AND PREFERRED EMBODIMENTS

The organic stripping compositions of this invention include those which contain as the main stripping agents one or more organic sulfonic acids which possess the property of being able to dissolve and disperse polymeric organic substances away from an inorganic substrate. Among the various classes of organic sulfonic acids which possess this property and are useful in the present invention are the alkyl-, monohydroxyalkyl-, aryl-, mono-alkylaryl-, dialkylaryl-, monohydroxyaryl-, monoalkyl-hydroxyaryl- and monochloro-hydroxyarylsulfonic acids.

Examples of alkyl sulfonic acids are those containing 1 to 18 carbon atoms, preferably linear alkyl sulfonic acids containing 10, 12 or 14 carbon atoms, such as linear dodecane sulfonic acid and linear decanesulfonic acid.

Examples of monohydroxyalkyl sulfonic acids are those containing 1 to 18 carbon atoms, preferably containing 15 to 18 carbons, in a linear or branched chain such as those produced by sulfonation og alpha-olefins. An example is the monohydroxy sulfonic acid mixture produced from the sulfonation of 1-octadecene.

Examples of arylsulfonic acids are those containing 6 to 10 carbon atoms and include naphthalene sulfonic acids, and preferably benzenesulfonic acid.

Examples of monoalkylarylsulfonic acids are those containing an alkyl group composed of 1 to 14 carbon atoms, which may be linear or branched such as toluenesulfonic acid, cumenesulfonic acid, decylbenzenesulfonic acid and dodecylbenzenesulfonic acid. Preferred among the monoalkylarylsulfonic acids are linear monoalkylbenzenesulfonic acids because of greater biodegradability such as toluenesulfonic acid (usually the para isomer predominates, but either isomer may be used), linear octyl-, decyl- and dodecylbenzenesulfonic acid.

Examples of dialkylarylsulfonic acids are those containing two alkyl groups each preferably linear and composed of 1 to 4 carbon atoms and include the isomers of xylenesulfonic acid and the isomers of methylethylbenzene sulfonic acid. Preferred are the isomers of xylenesulfonic acid either individually or in admixture.

Examples of monohydroxyarylsulfonic acids are those containing 6 to 10 carbon atoms and include the naphtholsulfonic acids and the phenolsulfonic acids. Preferred sulfonic acids in this group are the phenolsulfonic acids, either the ortho or para isomers, individually or in admixture.

Examples of monoalkyl-hydroxyarylsulfonic acids are those containing 7 to 11 carbon atoms and include methylnaphtholsulfonic acids and cresolsulfonic acids. A preferred example is cresolsulfonic acid, including all of its isomers either individually or in admixture.

Examples of monochloro-hydroxyarylsulfonic acids are those containing 6 to 10 carbon atoms and include chloronaphtholsulfonic acids and chlorophenolsulfonic acids. Preferred in this group are the chlorophenolsulfonic acids, including all of its isomers either individually or in admixture.

The compositions of this invention may contain one or more of the above-mentioned organic sulfonic acids, but it is preferred to use at least two organic sulfonic acids in combination which contain different R groups as defined above to maximize the stripping ability of the composition to remove polymeric organic substances. If only one organic sulfonic acid is used, it is preferred to use linear dodecylbenzenesulfonic acid in the composition because of its superior properties as a stripping agent, and its ready availability and low cost as constrasted to other organic sulfonic acids. When two or more organic sulfonic acids are used, it is preferred to use the combination of linear dodecylbenzenesulfonic acid/para-toluenesulfonic acid, or, if phenol is additionally used in the composition, then phenolsulfonic acid is preferably used in combination with linear dodecylbenzenesulfonic acid. Benzenesulfonic acid is also preferred, especially with compositions free of phenol and free of chlorinated hydrocarbons.

The organic sulfonic acid used either singly or in admixture, is generally present in the composition in the range of about 20 to 80 weight percent of the composition in the absence of phenol, and preferably about 30 to 60 weight percent. If used in combination with phenol, the sulfonic acid is generally used in the range of about 10 to 80 weight percent with the phenol comprising about 5 to 50 weight percent of the composition.

The solvents which are useful in the compositions of the present invention, either in the absence or in combination with phenol, are selected from the group consisting of aromatic hydrocarbons containing 6 to 14 carbon atoms, of which benzene and naphthalene are examples; aliphatic hydrocarbons containing 6 to 30 carbon atoms, of which dodecane, a mixture of isoparaffinic hydrocarbons with an average molecular weight between 150 and 210 and a boiling point between 160° and 220° C. and light and heavy minerals oils from the distillation of petroleum are examples; monoalkyl-substituted aromatic hydrocarbons containing 7 to 20 carbon atoms, of which the linear alkylbenzenes are preferred such as toluene, ethylbenzene, cumene, octylbenzene, decylbenzene and dodecylbenzene; dialkyl-substituted aromatic hydrocarbons containing 8 to 20 carbon atoms, of which the dialkylbenzenes such as the ortho, meta and para isomers of xylene and diethylbenzene are examples; trialkyl-substituted aromatic hydrocarbons containing 9 to 20 carbon atoms, of which the trialkylbenzenes such as 1,2,3, 1,2,4-and 1,3,5-isomers of trimethyl and triethylbenzene are examples; chlorinated aliphatic hydrocarbons containing 1 to 14 carbon atoms and 1 to 4 chlorine atoms, of which methylene chloride and tetrachloroethane are examples; chlorinated olefinic hydrocarbons containing 1 to 14 carbon atoms and 1 to 4 chlorine atoms of which those containing 2 to 4 carbon atoms and 3 to 4 chlorine atoms are preferred such as trichloroethylene and perchloroethylene (tetrachloroethylene); chlorinated aromatic hydrocarbons containing 6 to 12 carbon atoms and 1 to 4 chlorine atoms, of which the chlorinated benzenes containing 1 to 3 chlorine atoms are preferred such as ortho-dichlorobenzene and trichlorobenzene; aliphatic ketones containing 3 to 10 carbon atoms, of which acetone and methylethylketone and methyisobutylketone are examples; monoalkylethers of ethyleneglycol containing 3 to 10 carbon atoms, of which ethoxyethanol and butoxyethanol are examples; carboxylic acids containing 1 to 4 carbon atoms, of which acetic, mateic, and trichloroacetic acids are examples; cresols containing 7 to 10 carbon atoms, of which meta- and paracresol are examples; hydroxybenzenes containing 2 to 3 hydroxy groups, of which resorcinol and hydroquinone are examples; formamide; N,N-dialkylalkanoylamides containing 3 to 10 carbon atoms, of which dimethylformamide and dimethylacetamide are examples; N-alkyl lactams containing 6 to 12 carbon atoms, of which N-methylpyrrolidone is an example and cyclic aliphatic sulfones containing 4 to 6 carbon atoms, of which tetramethylenesulfone is an example. It should be appreciated that some of these solvents may also be the complexing agents of the hydrogen fluoride complex.

The solvents which are preferred for use either individually or in combination in the invention are the aliphatic hydrocarbons, preferably a mixture of isoparaffinic hydrocarbons with an average molecular weight between 150 to 210 and a boiling point between 160° and 220° C. and light and heavy mineral oils produced from the distillation of petroleum, the chlorinated olefinic hydrocarbons, preferably perchloroethylene, the chlorinated aromatic hydrocarbons, preferably orthodichlorobenzene, the monoalkyl-substituted aromatic hydrocarbons, preferably octylbenzene, decylbenzene or dodecylbenzene, the dialkyl-substituted aromatic hydrocarbons, preferably the individual isomers or mixtures thereof of xylene and diethylbenzene, respectively, and the trialkyl-substituted aromatic hydrocarbons, preferably the isomers of trimethylbenzene or mixtures thereof.

The solvent or solvent mixture employed in the organic compositions of this invention is generally present in an amount of about 20 to 90 weight percent, preferably 30 to 70 weight percent, of the composition.

The compositions of the present invention possess an important advantage over prior art organic compositions in that they contain only small amounts of fluoride ion which have surprisingly been found to inhibit the dulling and corrosion of metals, particularly aluminum, without causing substantial etching of the inorganic substrates, such as silicon, silicon dioxide and sapphire, particularly silicon dioxide, which subjected to the action of the stripping composition at a temperature of about 20° to 180° C., even after repeated use at such elevated temperatures. By the term "substantial etching" is meant an etch rate greater than about 0.2 A/minute of the thickness of an inorganic wafer, particularly silicon dioxide.

As indicated, the present invention includes a hydrogen fluoride complex as a part of the stripping composition. Fluoride may be added in various forms, including HF and various inorganic salts such as ammonium bifluoride ($NH_4HF_2$) or ammonium fluoborate ($NH_4BF_4$). It is believed, however, that such fluoride normally is converted in the acidic stripping compositions to HF. This HF may complex with the complexing agent also added to the composition.

It is preferred, however, to preform the complex by adding HF to the complexing agent (or vice versa) and then mixing the complex with the remainder of the organic stripping composition, as illustrated by the Examples herein.

The fluoride is normally present in the range of about 5 to 300 parts per million (ppm) by weight of the composition, a preferred range being from 100 to 250 ppm by weight, and a more preferred range being 150 to 250 ppm by weight. As indicated above, significantly higher amounts of fluoride ion tend to cause substantial etching of inorganic substrates.

The theory as to how fluoride ion exerts an inhibiting effect on the dulling and corrosive tendency of the stripping composition toward metals, particularly aluminum, is not fully understood. A plausible explanation, which we do not wish to be bound by, may be that the fluoride forms a temporary thin layer of aluminum fluoride-organic sulfonic acid complex on the surface of the aluminum which is then resistant to dulling and corrosion by the acidic components in the composition.

In the present invention the fluoride is in the form of a complex with a complexing agent present at at least about 0.1 mols per mol of HF, preferably at at least about 0.5 mols per mol of HF and most preferably at between about 0.5 and about 2.0 mols per mol of HF.

The complexing agent may be from several classes of organic materials having a nitrogen with an unshared electron pair. It may be a heterocyclic aromatic or heterocyclic saturated compound containing a cyclic nitrogen with an unshared electron pair such as morpholine, piperidine, pyridine, quinoline and quinoxaline.

The complexing agent may be an N-substituted or unsubstituted amide, preferably an N,N-dialkylamide such as dimethyl formamide (DMF), dimethyl acetamide (DMAC) or diethyl acetamide (DEAC). The complexing agent may also be a substituted or unsubstituted aniline such as aniline, N,N-dimethylaniline, 2,4 dimethylaniline or N,N-diethylaniline. Preferred complexing agents are N,N-dialkyl amides (and especially dimethyl formamide) and morpholine, with morpholine being most preferred.

A preferred phenol-containing composition comprises linear dodecylbenzenesulfonic acid, phenol, ortho-dichlorobenzene, para-toluenesulfonic acid or phenolsulfonic acid and optionally, perchloroethylene, wherein the total organic sulfonic acid is present in about 10 to 80 weight percent of the composition, phenol is present in about 5 to 50 weight percent of the composition and fluoride is present in a complex at about 5 to 250 ppm by weight of the composition. Typical compositions of this type comprise about 3 to 13 weight percent perchloroethylene, about 23 to 33 weight percent phenol, about 13 to 23 weight percent orthodichlorobenzene, about 23 to 33 weight percent linear dodecylbenzenesulfonic acid, about 13 to 23 weight percent para-toluene-sulfonic acid, about 5 to 250 ppm by weight of fluoride and mopholine or DMF at a molar ratio to HF of 2:1 to 1:2. A specific composition contains 8 weight percent perchloroethylene, 28 weight percent phenol, 18 weight percent orthodichlorobenzene, 28 weight percent linear dodecylbenzenesulfonic acid, 18 weight percent paratoluenesulfonic acid, 30 to 100 ppm by weight of fluoride ion and 110 to 915 ppm morpholine (an HF:morpholine molar ratio of 2:1 to 1:2) or 96 to 768 ppm DMF (an HF:DMF molar ratio of 2:1 to 1:2).

Another preferred phenol-containing composition comprises about 20 to 40 weight percent linear dodecylbenzenesulfonic acid, about 20 to 40 weight percent phenol, about 10 to 30 weight percent phenolsulfonic acid, about 10 to 30 weight percent orthodichlorobenzene, about 5 to 250 ppm by weight of fluoride and mopholine or DMF at a 1:2 or 2:1 molar ratio to HF. A specific composition of this type comprises 30 weight percent linear dodecylbenzenesulfonic acid, 25 weight percent phenol, 15 weight percent phenolsulfonic acid, 30 weight percent orthodichlorobenzene, 50 to 100 ppm by weight of fluoride ion and either 110 to 915 ppm morpholine (an HF:morpholine molar ratio of about 1:2 to 2:1) or 96 to 768 ppm dimethyl formamide (an HF:DMF molar ratio of about 1:2 to 2:1).

A preferred non-phenol containing composition comprises linear dodecylbenzene sulfonic acid, para-toluenesulfonic acid, an alkylbenzene selected from the group consisting of octylbenzene, decylbenzene or dodecylbenzene, and optionally, perchloroethylene and/or ortho-dichlorobenzene, wherein the total organic sulfonic acid is present in about 20 to 80 weight percent and fluoride is present in a complex at 5 to 300 ppm fluoride by weight of the composition. A preferred example would be 32 weight % dodecylbenzene sulfonic acid, 10 weight % dodecylbenzene, 28 weight % orthodichlorobenzene, 20 weight % perchloroethylene, 8 weight % toluene sulfonic acid, 100 to 250 ppm HF by weight of fluoride ion and either 229 ppm to 2290 ppm morpholine (an HF:morpholine molar ratio of about 1:2 to 2:1) or 192 to 1921 ppm dimethyl formamide (an HF:DMF molar ratio of about 1:2 to 2:1).

If pollution requirements with respect to chlorinated hydrocarbons are very stringent, then perchloroethylene and/or ortho-dichlorobenzene may be deleted without substantially affecting the efficacy of the photoresist removal properties of the composition. Also preferred for compositions free of both phenol and chlorinated hydrocarbons is about 5 to 60 weight percent benzene sulfonic acid, the substantial balance is dodecylbenzene sulfonic acid and alkylbenzenes and fluoride in a complex at 5 to 300 ppm fluoride.

It is to be noted that other useful combinations of organic sulfonic acid/organic solvents in the disclosed proportions beside those discussed above will be obvious to one skilled in the art from a reading of the disclosure.

Not only are the compositions of the organic strippers an object of this invention, but also the method of using the organic compositions of this invention. Normally, the compositions will be utilized in removing a polymeric organic substance such as a photoresist agent from the surface of a aluminized inorganic substrate by immersing the substrate into the stripping solution at a temperature of about 20° to 180° C. Normally, the surface of the inorganic substrate which is either silicon, sapphire or silicon dioxide will be metallized with aluminum, which is common in the area of photoresist applications used in the semi-conductor industry.

Typically, the photoresists which are commonly removed by the compositions of this invention are of the polyisoprene, polyvinyl cinnamate, and phenol-formaldehyde types as well as other types of polymeric organic substrates. These photoresists are applied to a substrate, e.g. silicon dioxide, silicon or aluminum, and portions of the material are then masked. The masked substrate is then exposed to light, e.g., a 120 volt 650 watt quartz lamp for 1 to 15 seconds at a distance of 6 to 12 inches to harden the exposed photoresist. With negative photoresists, the portion of the photoresist which is not exposed, i.e., masked from the light, is then removed by a mild solvent which does not dissolve the exposed photoresist thus leaving a pattern, e.g. a portion of an electrical circuit pattern, on the exposed substrate. The remaining photoresist is then baked for further hardening and the portion of the substrate which is not covered by the photoresist is etched or otherwise treated. The hardened photoresist must then be removed before the substrate can be further processed or used. In employing the stripping compositions of this invention, the substrate covered with the baked photoresist is contacted with the stripping solution at a temperature of about 20° to about 180° C., preferably between 90° and 120° C. Times required for stripping the photoresist vary to quite an extent, depending on the specific polymer used in the photoresist and photoresist processing conditions. Generally, the time involved will be between 1 and 10 minutes although some resists, depending upon the bake temperature, may require 15 minutes, 30 minutes or even an hour of contact with the stripping solution before the polymeric photoresist is loosened from the substrate, depending upon the degree of polymerization of the exposed photoresist and the thickness of the formed polymer. After the photoresist has been removed, the substrate is washed with a suitable solvent such as water, alcohol, or chlorinated hydrocarbon such as perchloroethylene to remove traces of the composition before drying.

The following examples are given for illustrative purposes only and are not to be construed as limitations upon the scope of the disclosed invention.

EXAMPLE I

Fluoride in Non-Phenol Stripper

This example illustrates the effectiveness of added fluoride ion to a typical non-phenol containing composition designated stripping composition "A", which contains 40 weight percent linear dodecylbenzenesulfonic acid, 20 weight percent dodecylbenzene, 25 weight percent perchloroethylene, 12 weight percent ortho-dichlorobenzene and 3 weight percent toluenesulfonic acid. Aluminum panels 1"×6"×0.002" were submerged into the stripping composition at 100° C. for 24 hours, washed and dried, and then the weight loss for each panel was measured. The results are tabulated in Table I.

TABLE I

| Stripping Composition | Type of Fluoride ion Added to the Stripping Composition | Parts per Million Fluoride Ion in the Composition | Aluminum Panels | |
|---|---|---|---|---|
| | | | Weight Loss in Milligrams | Loss in A/min. |
| "A" | none (blank) | none | 5.3 | 1.9 |
| "A" | 49% HF | 50 | 0.3 | 0.1 |
| "A" | 49% HF | 164 | 0.2 | 0.1 |
| "A" | none (blank) | none | 5.3 | 1.9 |
| "A" | NH$_4$F | 90 | 0.3 | 0.1 |

The data of Table I indicate that concentrations of 50 ppm, 90 ppm and 164 ppm by weight of fluoride ion by the addition of either 49% hydrofluoric acid or ammonium fluoride, in a typical non-phenol containing stripper composition markedly inhibited aluminum corrosion of the panels by more than a factor of 10 over the same nonfluoride-containing organic stripper. The loss in in A/min. refers to the decrease in the thickness of the aluminum panels as measured in Angstrom units (A) per minute. Other fluoride compounds such as NH$_4$BF$_4$ and NH$_4$F HF give similar results.

EXAMPLE II

Fluoride in Phenolic and Non-Phenolic Strippers

This example illustrates the effect of added fluoride ion on stripping composition "A", and typical phenol-containing compositions, "B" and "C", in inhibiting corrosion and dulling of aluminum panels of the type used in Example 1. The panels were submerged in the stripper composition for 24 hours at 100° C., washed with a suitable solvent, dried, and the weight loss and surface appearance were thereafter noted. The results are tabulated in Table II.

The designation "B" refers to a stripper composition containing 8 weight percent tetrachloroethylene, 18 weight percent ortho-dichlorobenzene, 28 weight percent phenol, 28 weight percent linear dodecylbenzenesulfonic acid and 18 weight percent toluenesulfonic acid.

The designation "C" refers to a stripper composition containing 30 weight percent linear dodecylbenzenesulfonic acid, 25 weight percent phenol, 15 weight percent phenolsulfonic acid and 30 weight percent orthodichlorobenzene. The symbol "F" designates fluoride ion from the addition of hydrofluoric acid.

TABLE II

| Stripper Composition | | Aluminum foil weight loss in milligrams | Aluminum Appearance |
| --- | --- | --- | --- |
| "A" | No F | 8.4 | dull |
| "A" | +5 pm F | 0.8 | bright |
| "A" | +10 ppm F | 0.4 | bright |
| "A" | +15 ppm F | 0.4 | bright |
| "A" | +25 ppm F | 0.3 | bright |
| "B" | No F | 5.2 | bright |
| "B" | +5 ppm F | 0.2 | bright |
| "B" | +10 ppm F | 0.2 | bright |
| "B" | +15 ppm F | 0.2 | bright |
| "B" | +25 ppm F | 0.2 | bright |
| "B" | +50 ppm F | 0.1 | bright |
| "C" | No F | 2.9 | bright |
| "C" | +50 ppm F | 0.2 | bright |

The data in Table II indicate that the phenolic photoresist strippers "B" and "C" do not require fluoride ion to maintain the brightness of the aluminum surface after treatment. However, those that did not contain fluoride ion significantly caused corrosion of the aluminum panel compared to the compositions containing at least 5 ppm of fluoride ion. The absence of fluoride ion in the non-phenolic composition "A" caused significant corrosion and dulling of the aluminum surface as compared to the composition containing at least 5 ppm F.

EXAMPLE III

This example illustrates the effect of added fluoride ion, in non-phenolic stripper composition "A", on a typical silicon dixoide coated wafer. Since it is known that HF can attack silicon dioxide glass, it was important to assess the effect of any etching of the silicon dioxide substrate. Silicon wafers containing a silicon dioxide coating were submerged in composition "A", containing different levels of fluoride ion by the addition of hydrofluoric acid, for 24 hours at 100° C. and then inspected for weight loss. The results are tabulated in Table IV.

TABLE III

| Stripper Composition | | Surface Appearance | Weight Loss in milligrams of the Wafer | Etch Rate in A/min. |
| --- | --- | --- | --- | --- |
| "A" | No F | uniform | 0 | 0 |
| "A" | 100 ppm F | uniform | 0 | 0 |
| "A" | 200 ppm F | uniform | 0.2 | 0.08 |
| "A" | 250 ppm F | uniform | 0.3 | 0.1 |
| "A" | 500 ppm F | shaded | 1.5 | 0.6 |

The data indicate that the addition of fluoride ion of 100 ppm to the non-phenol type stripping composition "A" does not promote fluoride ion attack of the silicon dioxide surface, as indicated by the absence of any weight decrease of the wafer. However, at the 200 ppm and 250 ppm fluoride levels, a very slight decrease in the width of the wafer is noted indicating very slight etching of the silicon dioxide surface. Higher degrees of etching, which are obtained with levels of fluoride ion significantly above 250 ppm in both phenol containing and non-phenol containing compositions of this invention, are undesirable and tend to lead to substantial etching of the silicon dioxide wafer, as well as a non-uniform surface appearance.

EXAMPLE IV

Hydrogen Fluoride Complexes In Non-Phenolic Stripper

Complexes were prepared by mixing equimolar amounts of HF (as a 49–50% solution in water) with morpholine, dimethylformamide (DMF), pyridine, aniline, hexamethylenetetramine (HMTA) and diethanolamine. The complexes were then added to Stripping Compositon D (a variant of A) at levels giving 100 or 300 ppm fluoride by weight of composition. Stripping composition D contained 32 weight % dodecylbenzene sulfonic acid, 12 weight % dodecyl benzene, 28 weight % orthodichlorobenzene, 20 weight % perchloroethylene and 8 weight % toluene sulfonic acid.

The total composition was then heated in an open top container for 1.5–4 hours before being subjected to the 24-hour aluminum corrosion test of Example 1. The results are shown in Table IV.

TABLE IV

Tests After 1.5–4 Hours In Open Container at 100° C.

| Stripping Composition | Initial Flouride Level | Aluminum Foil Weight Loss (mg) | Etch Rate in A/min |
| --- | --- | --- | --- |
| D + HF-morpholine | 75 | 1.8 | 0.65 |
| D + HF-morpholine | 150 | 0.8 | 0.28 |
| D + HF-morpholine | 250 | 0.6 | 0.21 |
| D + HF-DMF | 150 | 3.6 | 1.26 |
| D + HF-DMF | 235 | 4.2 | 1.44 |
| D + HF-pyridine | 75 | 33.6 | 11.7 |
| D + HF-pyridine | 100 | 18.1 | 6.3 |
| D + HF-aniline | 75 | 43.2 | 15.2 |
| D + HF-aniline | 175 | 2.1 | 0.75 |
| Comparisons | | | |
| D + HF-HMTA | 75 | 40.8 | 14.3 |
| D + HF-HMTA | 150 | 23.8 | 8.3 |
| D + HF-diethanolamine | 100 | 30 | 10.8 |
| D + methanesulfonyl fluoride | 200 | 68 | 23.9 |
| D + tetramethylammonium fluoride | 100 | 36.3 | 12.7 |
| D + benzoyl fluoride | 200 | 180 | 63 |
| D + o-nitrobenzene sulfonic fluoride | 200 | 62.4 | 21.8 |
| D + Tetraethylammonium fluoride* | 250 | 43.1 | 14 |
| D + Trifluoroacetic acid | 300 | 74.4 | 26 |
| D + Hexafluoroacetone* | 50 | 28.2 | 10 |

*No heating prior to treatment

EXAMPLE V

HF Loss From Strippers

Equimolar amounts of morpholine or dimethyl formamide and HF were added to Composition D and the mixture heated at 100° C. for 2–4 hours. The fluoride content was analyzed in samples taken at 2 and 4 hours. The results indicate that strippers with uncomplexed HF decreased quickly so as to be negligible within one hour. Similar levels of HF complex retained fluoride content for increased periods. When HF complex in the preferred 100 to 300 ppm range (by weight of fluorine) was used, the fluoride concentration remained at at least about 5 ppm, which is sufficient to inhibit aluminum corrosion, even after four hours at 100° C.

I claim:

1. In an improved organic stripping composition for removing polymeric organic substances from aluminized inorganic substrates comprising at least one organic sulfonic acid of the formula $$R-SO_3H$$

wherein R is an organic radical selected from the group consisting of alkyl containing 1 to 18 carbon atoms, monohydroxyalkyl containing 1 to 18 carbon atoms, aryl containing 6 to 10 carbon atoms, monoalkylaryl wherein the alkyl group contains 1 to 14 carbon atoms, dialkylaryl wherein each alkyl group contains 1 to 4 carbon atoms, monohydroxyaryl containing 6 to 10 carbon atoms, monoalkyl-hydroxyaryl containing 7 to 11 carbon atoms and monochloro-hydroxyaryl containing 6 to 10 carbon atoms, and at least one organic solvent, the improvement which comprises incorporating a hydrogen fluoride complex comprising HF at about 5 to about 300 ppm by weight of fluoride per weight of composition and at least about 0.1 mols per mol of HF of an organic complexing agent having a nitrogen with an unshared electron pair selected from the group consisting of heterocyclic aromatic and heterocyclic saturated compounds containing a cyclic nitrogen with an unshared electron pair, N-substituted and unsubstituted amides and substituted and unsubstituted anilines.

2. The composition of claim 1 wherein said hydrogen fluoride complex contains at least about 0.5 mols of complexing agent per mol of HF.

3. The composition of claim 2 wherein said hydrogen fluoride complex contains between about 0.5 and about 2.0 mols of complexing agent per mol of HF.

4. The composition of claim 1 wherein said complexing agent is morpholine.

5. The composition of claim 1 wherein said complexing agent is an N,N-dialkylamide.

6. The composition of claim 5 wherein said complexing agent is dimethylformamide.

7. The composition of claim 1 wherein said HF complex includes HF at about 100 to about 300 ppm by weight of fluorine per weight of composition.

8. The composition of claim 7 wherein said HF complex includes HF at about 150 to about 250 by weight of fluorine per weight of composition.

9. The composition of claim 1 wherein the organic sulfonic acid comprises a member selected from the group consisting of toluenesulfonic acid, cumenesulfonic acid, linear dodecylbenzenesulfonic acid, benzenesulfonic acid, phenolsulfonic acid and mixtures thereof.

10. The composition of claim 1 wherein the organic solvent is selected from the group consisting of aromatic hydrocarbons containing 6 to 14 carbon atoms, aliphatic hydrocarbons containing 1 to 30 carbon atoms, monoalkyl-substituted aromatic hydrocarbons containing 7 to 20 carbon atoms, dialkyl-substituted aromatic hydrocarbons containing 8 to 20 carbon atoms, trialkyl-substituted aromatic hydrocarbons containing 9 to 20 carbon atoms, chlorinated aliphatic hydrocarbons containing 1 to 14 carbon atoms and 1 to 4 chlorine atoms, chlorinated olefinic hydrocarbons containing 1 to 14 carbon atoms and 1 to 4 chlorine atoms, chlorinated aromatic hydrocarbons containing 6 to 12 carbon atoms and 1 to 4 chlorine atoms, aliphatic ketones containing 3 to 10 carbon atoms, monoalkylethers of ethylene glycol containing 3 to 10 carbon atoms, formamide, N-alkyl lactams containing 6 to 12 carbon atoms, N,N-dialkylalkanoylamides containing 3 to 10 carbon atoms, cyclic aliphatic sulfones containing 4 to 6 carbon atoms, carboxylic acids containing 1 to 4 carbon atoms, cresols containing 7 to 10 carbon atoms, and hydroxybenzenes containing 2 to 3 hydroxy groups and mixtures thereof.

11. The composition of claim 1 wherein the organic solvent is selected from the group consisting of octylbenzene, decylbenzene, dodecylbenzene, perchloroethylene, ortho-dichlorobenzene and mixtures thereof.

12. The composition of claim 1 in which phenol is not present and the organic sulfonic acid comprises about 20 to 80 weight percent of the composition.

13. The composition of claim 1 in which phenol is present in an amount of about 5 to 50 weight percent of the composition and the organic sulfonic acid comprises about 10 to 80 weight percent of the composition.

14. A method of stripping a polymeric organic substance from a aluminized inorganic substrate comprising contacting the polymeric organic substance with the composition of claim 1 at a temperature of about 20° to about 180° C.

15. The method of claim 14 wherein said polymeric organic substance is a photoresist which comprises a polymer selected from the group consisting of polyisoprene, polyvinyl cinnamate and phenol-formaldehyde resins, and wherein the inorganic substrate is silicon dioxide.

16. The method of claim 14 wherein said hydrogen fluoride complex contains between about 0.5 and about 2.0 moles of complexing agent per mole of HF.

17. The method of claim 14 wherein said complexing agent is morpholine.

18. The method of claim 14 wherein said complexing agent is an N,N-dialkylamide.

19. The method of claim 14 wherein said HF complex includes HF at about 100 to about 300 ppm by weight of fluorine per weight of composition.

20. The method of claim 14 wherein the organic sulfonic acid comprises a member selected from the group consisting of toluenesulfonic acid, cumenesulfonic acid, linear dodecylbenzenesulfonic acid, benzenesulfonic acid, phenolsulfonic acid and mixtures thereof.

* * * * *